United States Patent
Lu

(12) 
(10) Patent No.: US 6,197,629 B1
(45) Date of Patent: Mar. 6, 2001

(54) METHOD OF FABRICATING A POLYSILICON-BASED LOAD CIRCUIT FOR STATIC RANDOM-ACCESS MEMORY

(75) Inventor: Tse-Yi Lu, Chiayi (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/195,923

(22) Filed: Nov. 19, 1998

(51) Int. Cl.$^7$ ................................................ H01L 21/8234
(52) U.S. Cl. ...................... 438/238; 438/238; 438/652; 438/649; 438/276; 438/286; 438/307; 437/41; 437/47; 437/52; 437/193; 437/240; 437/241
(58) Field of Search ...................... 438/238, 652, 438/649, 276, 286, 307; 437/41, 47, 52, 240, 241, 193

(56) References Cited

U.S. PATENT DOCUMENTS

| | | | |
|---|---|---|---|
| 5,179,033 | * 1/1993 | Adan | 437/41 |
| 5,552,332 | * 9/1996 | Tseng et al. | 437/240 |
| 5,593,906 | * 1/1997 | Shimizu | 437/31 |
| 5,719,083 | * 2/1998 | Komatsu | 438/652 |
| 5,757,031 | * 5/1998 | Natsume | 257/67 |
| 5,840,601 | * 11/1998 | Cho | 438/151 |
| 5,904,529 | * 5/1999 | Gardner et al. | 438/286 |
| 5,907,789 | * 5/1999 | Komatsu | 438/649 |
| 6,008,093 | * 12/1999 | Aoki et al. | 438/276 |

* cited by examiner

*Primary Examiner*—David Nelms
*Assistant Examiner*—Phuc Dang
(74) *Attorney, Agent, or Firm*—Thomas, Kayden, Horstemeyer & Risley

(57) ABSTRACT

A semiconductor fabrication method is provided for the fabrication of a polysilicon-based load circuit (called poly-load) for SRAM (static random-access memory). In accordance with this method, a lightly doped polysilicon layer is formed. This lightly doped polysilicon layer is doped with an impurity element to a predetermined concentration corresponding to the desired resistive characteristic of the poly-load. Further, this lightly-doped polysilicon layer is partitioned into two parts: a first part to be formed into the desired poly-load and a second part to be formed into a conductive interconnecting line that is electrically connected to the poly-load. After this, a metal silicide layer is formed over the second part of the lightly doped polysilicon layer to serve as the conductive interconnecting line. Next, an ILD (Inter Layer Dielectric) layer is formed over the poly-load and the conductive interconnecting line, and then the ILD layer is subjected to a densification process. This method can help the poly-load retain its specified length, thus allowing the SRAM device to be further reduced in size to a deep submicron level of integration. Moreover, the method can help the conductive interconnecting line have a low sheet resistance, thus reducing the IR drop across each memory cell to allow a SRAM device to be more stable in operation.

18 Claims, 4 Drawing Sheets

METHOD OF FABRICATING A POLYSILICON-BASED LOAD CIRCUIT FOR STATIC RANDOM-ACCESS MEMORY

BACKGROUND OF THE INVENTION

1. Field of the Invention

This invention relates to a semiconductor fabrication method, and more particularly to a method of fabricating a polysilicon-based load circuit (customarily referred to as poly-load) for SRAM (static random-access memory).

2. Description of Related Art

SRAM is a high-speed volatile semiconductor memory widely used in all various kinds of computers and intelligent electronic devices. An SRAM device is typically composed of a peripheral circuit and a memory cell array. The peripheral circuit includes address decoders that can decode address signals to gain access to the memory cells in the SRAM device. Each SRAM cell is typically composed of an access circuit, a drive circuit, and a load circuit. The circuit structure of a typical SRAM cell is illustratively depicted in the following with reference to FIG. 1.

FIG. 1 is a schematic circuit diagram of a typical 4T (4-transistor) SRAM cell. As shown, the SRAM cell is composed of four MOS transistors $T_1$, $T_2$, $T_3$, $T_4$ and two resistors $R_1$, $R_2$. The two MOS transistors $T_1$, $T_2$ in combination constitute a drive circuit for the SRAM cell. The other two MOS transistors $T_3$, $T_4$ in combination constitute an access circuit for the SRAM cell, and the two resistors $R_1$, $R_2$ in combination constitute a load circuit for the SRAM cell.

The first resistor $R_1$ has one end connected to the system voltage $V_{DD}$ and the other end connected to a node A. The second resistor $R_2$ has one end connected to the system voltage $V_{DD}$ and the other end connected to a node B. The first MOS transistor $T_1$ is connected in such a manner that its gate is connected to the node B, its drain is connected to the node A, and its source is connected to the ground voltage $V_{SS}$. The second MOS transistor $T_2$ is connected in such a manner that its gate is connected to the node A, its drain is connected to the node B, and its source is connected to the ground voltage $V_{SS}$. The third MOS transistor $T_3$ is connected in such a manner that its gate is connected to a word line WL, its source (or drain) is connected to a bit line BL, and its drain (or source) is connected to the node A. The fourth MOS transistor $T_4$ is connected in such a manner that its gate is connected to the word line WL, its source (or drain) is connected to a complementary bit line $\overline{BL}$, and its drain (or source) is connected to the node B.

Access to the foregoing SRAM cell is controlled by the access circuit, i.e., the third and fourth MOS transistors $T_3$, $T_4$ whose switching states are further controlled by the voltage state on the word line WL. Moreover, the data stored in this SRAM cell is dependent on the switching states of the drive circuit, i.e., the first and second MOS transistors $T_1$, $T_2$. The operations accessing this SRAM cell, both write and read, are well known to those skilled in the art of semiconductor memories and not within the spirit and scope of the invention, so description thereof will not be further detailed.

Conventionally, the load circuit of an SRAM cell is fabricated by forming high-resistance polysilicon lines over a semiconductor substrate (thus the name poly-load). A conventional method for fabricating a poly-load for SRAM is illustratively depicted in the following with reference to FIGS. 2A–2D.

FIG. 2A illustrates construction of the SRAM device on a semiconductor substrate 20. A gate 21 is then formed over the substrate 20. Next, an insulating layer 22 is deposited over the entire top surface of the wafer, covering all of the exposed surfaces of the substrate 20 and the gate 21. The insulating layer 22 is then selectively removed through a photolithographic and etching process to form a via hole to expose the gate 21.

FIG. 2B illustrates the subsequent step, in which a thin polysilicon layer 23 is deposited over the insulating layer 22. The polysilicon layer 23 is then defined using conventional lithographic and etch processes to form predetermined interconnecting line and poly-load. After this, a first ion-implantation process is performed on the wafer to dope an impurity element in ion form with a low concentration into the entire polysilicon layer 23 so as to turn the polysilicon layer 23 into a lightly-doped polysilicon layer.

FIG. 2C illustrates the subsequent step, in which a photoresist layer 24 is coated over the wafer. This photoresist layer 24 is selectively removed to form an opening 25 to expose a first part of the polysilicon layer 23, as indicated by the reference numeral 23a, that is predefined to be formed into a conductive interconnecting line, while covering a second part of the same, as indicated by the reference numeral 23b, that is predefined to be formed into the desired poly-load. Subsequently, with the photoresist layer 24 serving as mask, a second ion-implantation process is performed on the wafer so as to further dope an impurity element into the unmasked first part 23a of the polysilicon layer 23, whereby the first part 23a of the polysilicon layer 23 is turned into a highly-doped polysilicon layer. This forms one highly doped polysilicon layer 23a and one lightly doped polysilicon layer 23b from the original polysilicon layer 23. The highly doped polysilicon layer 23a has a low resistance and is used to serve as a conductive interconnecting line. The lightly doped polysilicon layer 23b, on the other hand, has a high resistance and serves as the load circuit of the SRAM cell (i.e., the above-mentioned poly-load). The value of the resistance of the lightly-doped polysilicon layer 23b is dependent on the ion concentration used in the first ion-implantation process and the dimensions (i.e., thickness, width, and length) of the lightly-doped polysilicon layer 23b.

Referring further to FIG. 2D, in the subsequent step, the entire photoresist layer 24 is removed. Next, a dielectric layer 26 is deposited over the entire top surface of the wafer, covering all the exposed surfaces of the highly-doped polysilicon layer 23a and the lightly-doped polysilicon layer 23b. After this, an ILD (Inter Layer Dielectric) layer 27 is deposited over the dielectric layer 26. A densification process is then performed on the ILD layer 27 so as to densify the ILD layer 27 and to activate the impurity in the polysilicon layer 23. This completes the fabrication of the poly-load for one SRAM cell.

Theoretically the value of the resistance of the lightly-doped polysilicon layer 23b (i.e., the poly-load) is dependent on the ion concentration used in the first ion-implantation process and the dimensions, i.e., thickness, width, and length, of the lightly-doped polysilicon layer 23b. However, during the densification process, the impurity ions in the highly-doped polysilicon layer 23a are forced to diffuse toward the lightly-doped polysilicon layer 23b (which is called lateral diffusion), thus causing the lightly-doped polysilicon layer 23b to be reduced in length. This not only causes the resultant poly-load to be undesirably changed in resistance, but also makes the SRAM device unsuitable to be further reduced to a submicron level of integration.

One solution to the foregoing problem is to reduce the concentration of the impurity ions in the highly doped polysilicon layer 23a to a lower level. However, this then causes the resultant conductive interconnecting line to have an increase in sheet resistance, thus leading to the undesired occurrence of a severe IR drop (also called voltage drop) across each memory cell in the SRAM device. This adversely affects the stability of the SRAM device.

SUMMARY OF THE INVENTION

It is therefore an objective of the present invention to provide a method for fabricating a poly-load for a SRAM device, which can help allow the resultant poly-load to retain its specified length without being reduced due to lateral diffusion.

It is another objective of the present invention to provide a method for fabricating a poly-load for a SRAM device, which can help allow the SRAM device to be further down-scalable to deep submicron level of integration by allowing the resultant poly-load to retain its specified length.

It is still another objective of the present invention to provide a method for fabricating a poly-load for a SRAM device, which allows the conductive interconnecting lines in the SRAM device to have a low sheet resistance.

In accordance with the foregoing and other objectives of the present invention, an improved method for fabricating a poly-load for a SRAM device is provided.

The method of the invention includes the initial steps of forming a gate over the substrate, forming an insulating layer over the substrate, and forming a via hole in the insulating layer to expose the gate. Subsequently, a lightly doped polysilicon layer is deposited over the insulating layer. The lightly-doped polysilicon layer is partitioned into two parts: a first part to be formed into the desired poly-load and a second part to be formed into a conductive interconnecting line electrically connected to the poly-load. A metal silicide layer is then formed over the second part of the lightly doped polysilicon layer to serve as the conductive interconnecting line. An ILD (Inter Layer Dielectric) layer is then formed over the poly-load and the conductive interconnecting line, and the ILD layer is then subjected to a densification process. This method of the invention can help the poly-load to retain its specified length without being affect by lateral diffusion, thus allowing the SRAM device to be further reduced in size to a submicron level of integration. Moreover, the method of the invention helps the conductive interconnecting line to have a low sheet resistance, thus reducing the IR drop across each memory cell to allow SRAM device to be more stable in operation.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
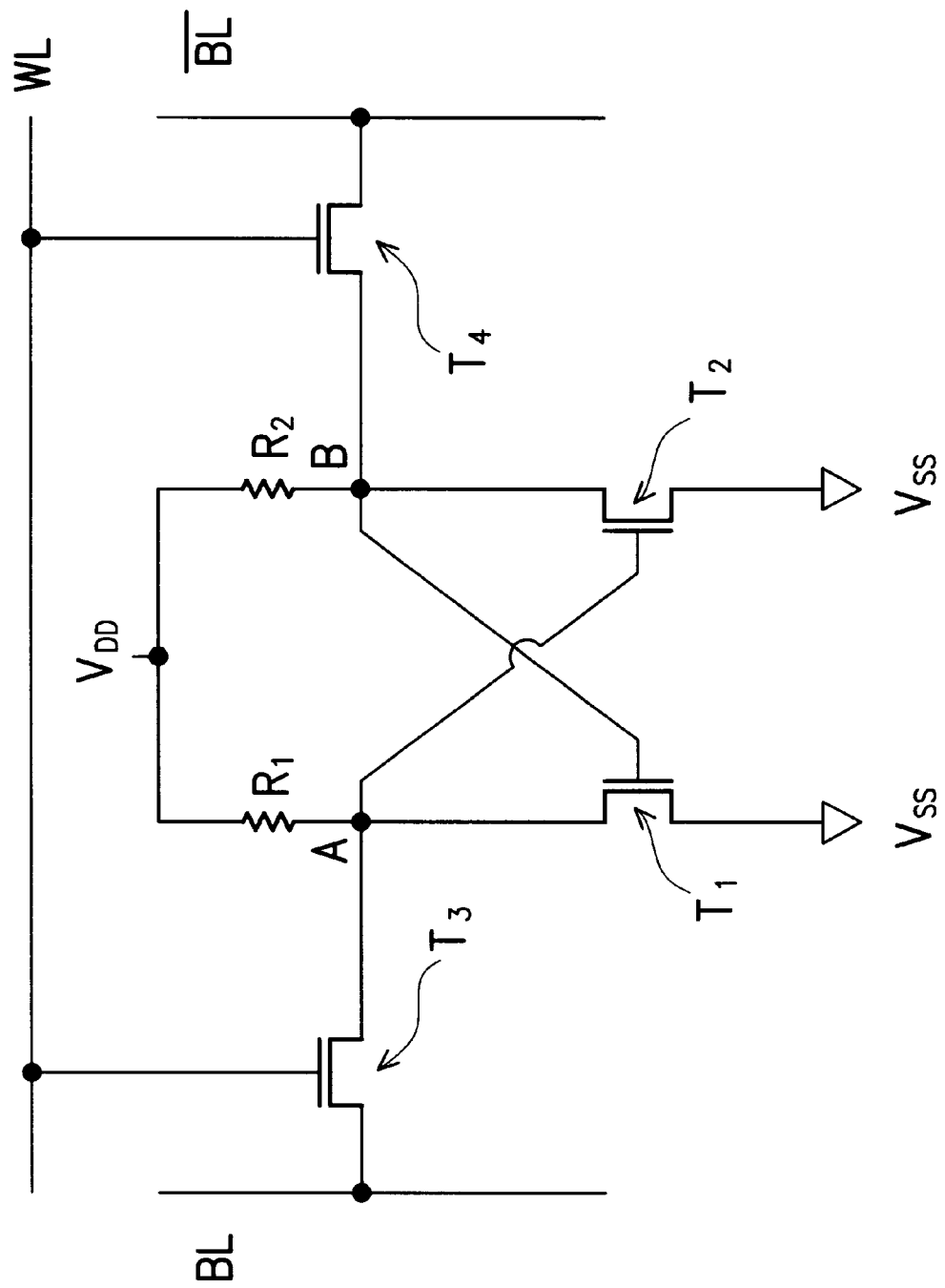
FIG. 1 is a schematic circuit diagram of a typical 4T SRAM cell.
Figure 2A:
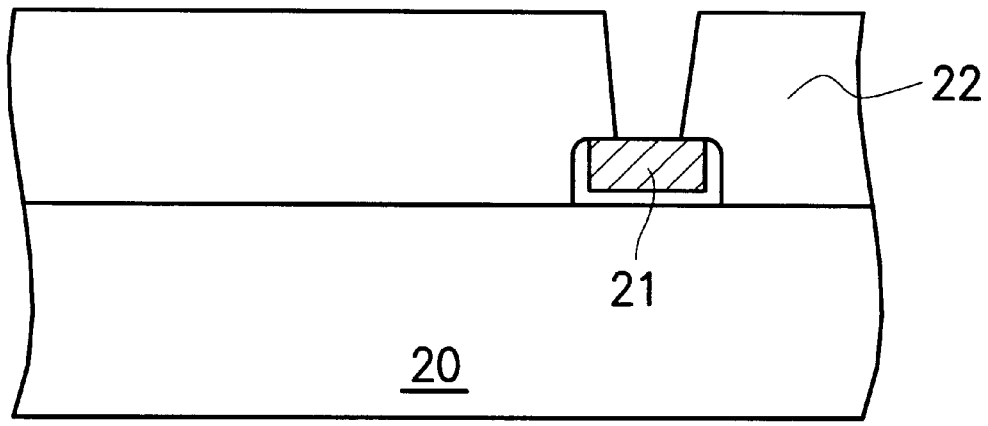
FIGS. 2A–2D are schematic sectional diagrams used to depict the process steps involved in a conventional method for fabricating a poly-load for SRAM.
Figure 2B:
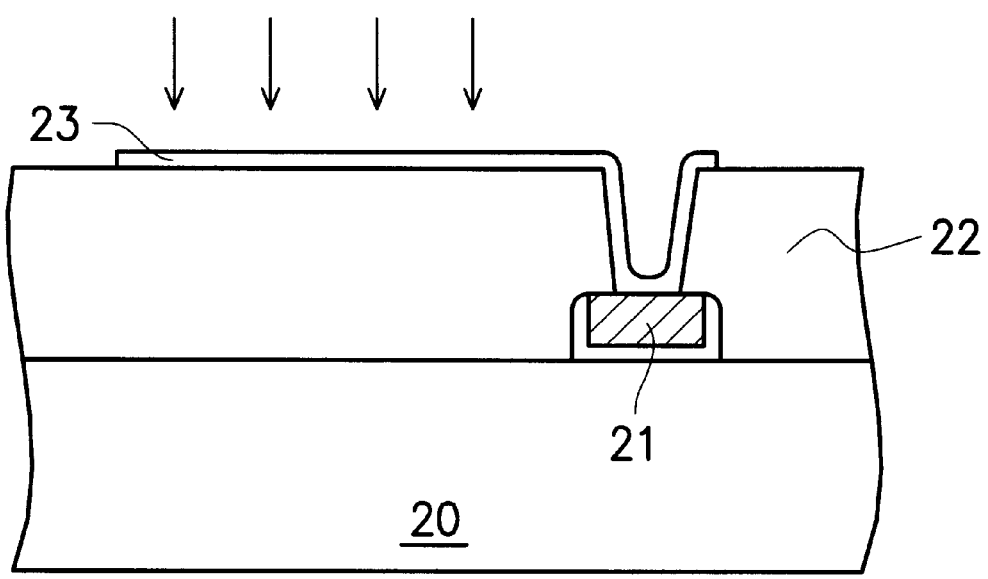
Figure 2C:
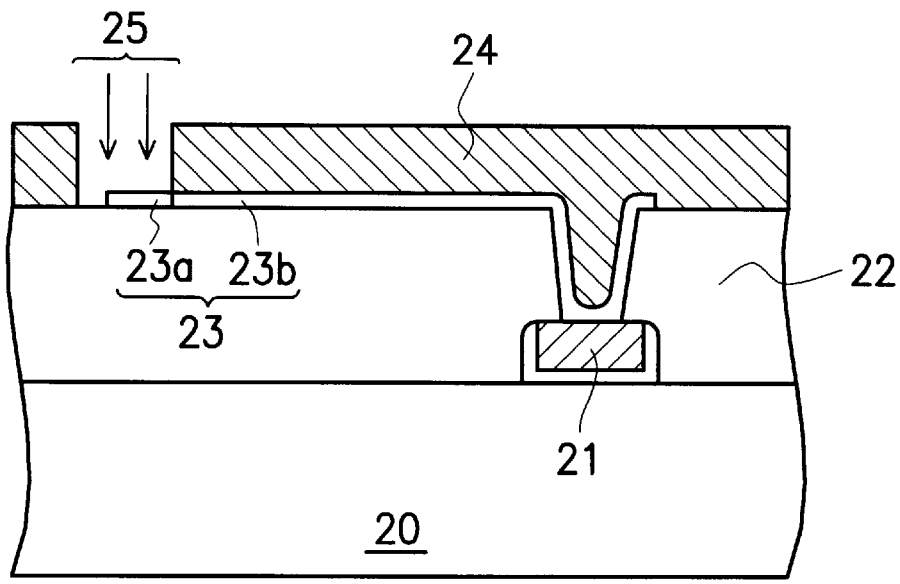
Figure 2D:
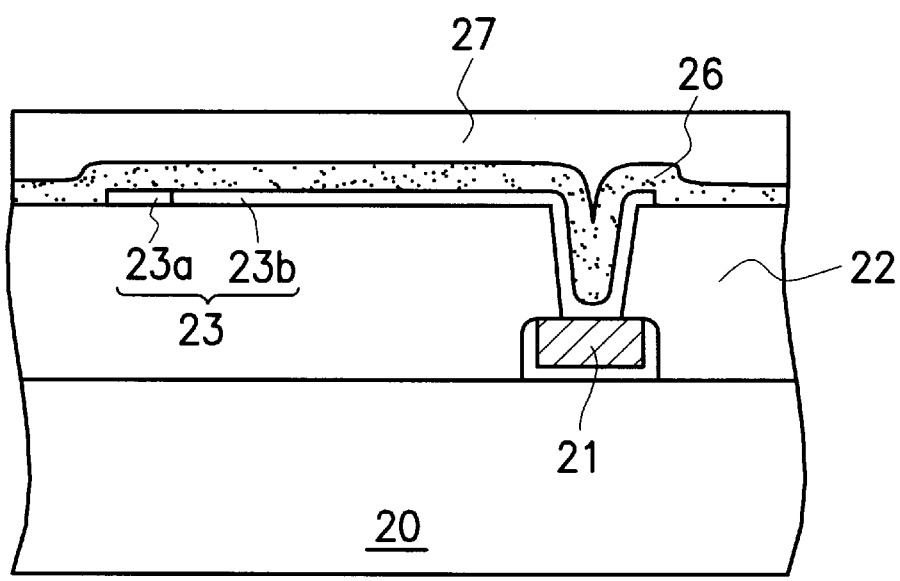

A preferred embodiment of the method of the invention is disclosed in the following with reference to FIGS. 3A–3C. The first step described with reference to FIG. 3A immediately follows the step of forming the lightly-doped polysilicon layer 23 depicted in FIG. 2B. The ion-implantation process used to form this lightly-doped polysilicon layer 23 is performed with a predetermined ion concentration corresponding to the desired resistive characteristic (defined in terms of resistance value per unit cross sectional area) of the desired poly-load.

Figure 3A:
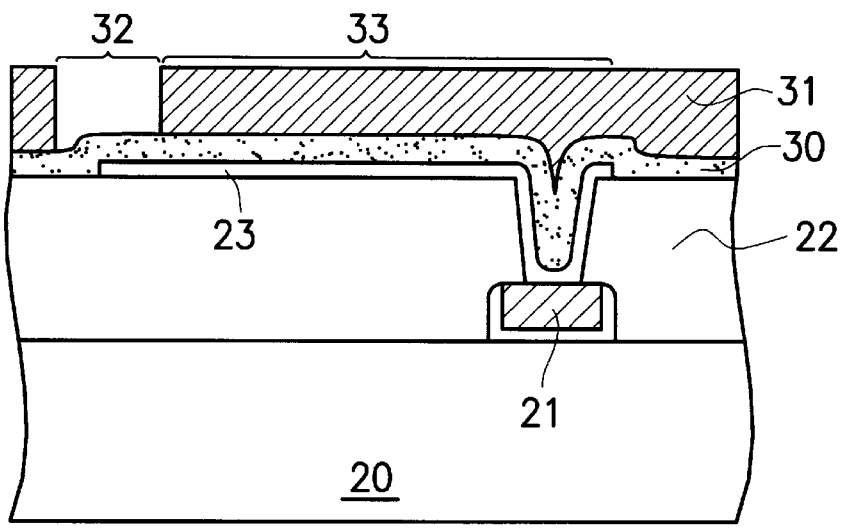
FIGS. 3A–3C are schematic sectional diagrams used to depict the process steps involved in the method of the invention for fabricating a poly-load for SRAM.

In FIG. 3A, in accordance with the invention, after the lightly doped polysilicon layer 23 is formed, the next step is to deposit a dielectric layer 30 over the entire top surface of the wafer. Dielectric layer 30 covers all the exposed surfaces of the lightly doped polysilicon layer 23 and the insulating layer 22. This dielectric layer 30 can be an oxide layer that is formed, for example, from TEOS (tetra-ethyl-orthosilicate) through a CVD (chemical-vapor deposition) process. Next, a photoresist layer 31 is coated over the dielectric layer 30. This photoresist layer 31 is selectively removed to expose a first part of the polysilicon layer 23, as indicated by the reference numeral 32 in FIG. 3A, that is predefined to be formed into a conductive interconnecting line, while covering a second part of the same, as indicated by the reference numeral 33, that is predefined to be formed into the desired poly-load.

Figure 3B:
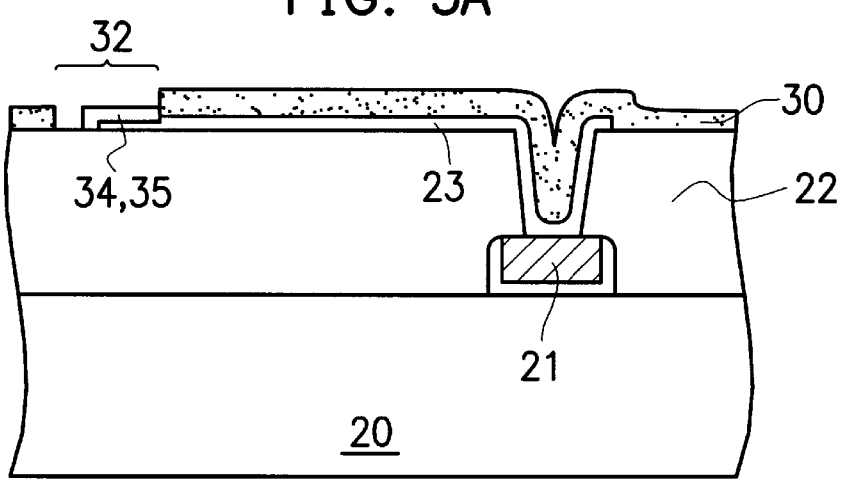

FIG. 3B illustrates the subsequent step, in which, with the photoresist layer 31 serving as mask, an etching process is performed on the wafer so as to etch away the unmasked part of the dielectric layer 30 until the surface of the first part 32 of the polysilicon layer 23 is exposed. After this, the entire photoresist layer 31 is removed. Next, a thin film of a refractory metal 34, such as titanium, is deposited over the first part 32 of the polysilicon layer 23. After this, an RTP (Rapid Thermal Process) is performed to convert the refractory metal film 34 into metal silicide layer 35 (which is titanium silicide when titanium is used to form the refractory metal film 34). Next, the unreacted part of the refractory metal is removed through a selective etching process.

Figure 3C:
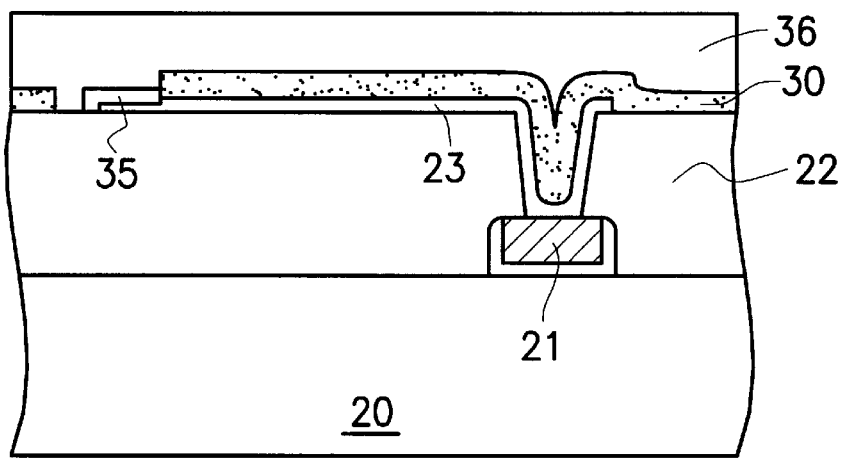

FIG. 3C illustrates the final step, an ILD (Inter Layer Dielectric) layer 36 is deposited over the entire top surface of the wafer, covering the exposed surfaces of all the components currently formed over the substrate 20. A densification process is then performed on the ILD layer 36 so as to densify the ILD layer 36. This completes the fabrication of the poly-load for the SRAM device.

It is a characteristic feature of the invention that the conductive interconnecting line is formed from a metal silicide layer rather than from a highly doped polysilicon layer as in the prior art. Therefore, the drawback of lateral diffusion in the prior art cannot occur here, thus allowing the poly-load to retain its specified length without being reduced due to lateral diffusion. This feature can help the SRAM device to be further reduced in size to a deep submicron level of integration without having undesired effects.

Moreover, since metal silicide is typically much smaller in resistance than highly-doped polysilicon, the invention can help the resultant conductive interconnecting line to retain a low sheet resistance, thus significantly reducing the IR drop across each memory cell. The SRAM device can thus operate with more stability.

In conclusion, the method of the invention has the following advantages over the prior art.

First, the method of the invention can help the resultant poly-load to retain its specified length through the prevention of lateral diffusion by using metal silicide instead of highly-doped polysilicon to form the conductive interconnecting line that is electrically connected to the poly-load.

Second, the method of the invention can help the SRAM device to be further reduced in size to a deep submicron level of integration.

Third, the method of the invention can help reduce the IR drop across each memory cell, thus allowing stable operation to the SRAM device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a poly-load for SRAM constructed on a semiconductor substrate, the method comprising the steps of:

forming a gate over the substrate;

forming an insulating layer over the substrate, which covers all the exposed surfaces of the gate and the substrate;

forming a via hole in the insulating layer to expose the gate;

forming a polysilicon layer over the insulating layer;

performing an ion-implantation process to dope an impurity element into the entire polysilicon layer to form a lightly doped polysilicon layer;

depositing a dielectric layer over the lightly doped polysilicon layer;

forming a mask layer over the dielectric layer, which masks a first part of the lightly-doped polysilicon layer that is predefined to be formed into the poly-load while unmasking a second part of the lightly-doped polysilicon layer that is predefined to be formed into a conductive interconnecting line;

removing the part of the dielectric layer that is laid directly over the second part of the lightly doped polysilicon layer;

forming a metal silicide layer over the second part of the lightly doped polysilicon layer to serve as the conductive interconnecting line;

depositing an ILD layer to cover all the exposed surfaces of the dielectric layer and the metal silicide layer; and performing a densification process on the ILD layer.

2. The method of claim 1, wherein the polysilicon layer is deposited over the insulating layer to cover the exposed surface of the gate.

3. The method of claim 1, wherein the ion-implantation process is performed with a predetermined ion concentration corresponding to the desired resistive characteristic of the poly-load.

4. The method of claim 1, wherein the dielectric layer is formed through a CVD process.

5. The method of claim 4, wherein the dielectric layer is an oxide layer formed from TEOS.

6. The method of claim 1, wherein the step of forming the metal silicide layer includes the substeps of:

forming a refractory metal film over the second part of the lightly doped polysilicon layer;

performing an RTP on the refractory metal film to form metal silicide; and removing the unreacted part of the refractory metal.

7. The method of claim 6, wherein the refractory metal is titanium.

8. The method of claim 7, wherein the metal silicide layer is a layer of titanium silicide.

9. The method of claim 6, wherein the removing of the unreacted part of the refractory metal is carried out through a selective etching process.

10. A method for fabricating a poly-load which is electrically connected to a conductive layer formed on a semiconductor substrate, the method comprising the steps of:

forming an insulating layer over the substrate;

forming a polysilicon layer over the insulating layer;

performing an ion-implantation process to dope an impurity element into the entire polysilicon layer to form a lightly doped polysilicon layer;

depositing a dielectric layer over the lightly doped polysilicon layer;

forming a mask layer over the dielectric layer, which masks a first part of the lightly-doped polysilicon layer that is predefined to be formed into the poly-load while unmasking a second part of the lightly-doped polysilicon layer that is predefined to be formed into a conductive interconnecting line;

removing the part of the dielectric layer that is laid directly over the second part of the lightly doped polysilicon layer;

forming a metal silicide layer over the second part of the lightly doped polysilicon layer to serve as the conductive interconnecting line;

depositing an ILD layer to cover all the exposed surfaces of the dielectric layer and the metal silicide layer; and performing a densification process on the ILD layer.

11. The method of claim 10, wherein the polysilicon layer is deposited over the insulating layer to cover the exposed surface of the conductive layer.

12. The method of claim 10, wherein the ion-implantation process is performed with a predetermined ion concentration corresponding to the desired resistive characteristic of the poly-load.

13. The method of claim 10, wherein the dielectric layer is formed through a CVD process.

14. The method of claim 13, wherein the dielectric layer is an oxide layer formed from TEOS.

15. The method of claim 10, wherein the step of forming the metal silicide layer includes the substeps of:

forming a refractory metal film over the second part of the lightly doped polysilicon layer;

performing an RTP on the refractory metal film to form metal silicide; and removing the unreacted part of the refractory metal.

16. The method of claim 15, wherein the refractory metal is titanium.

17. The method of claim 16, wherein the metal silicide layer is a layer of titanium silicide.

18. The method of claim 15, wherein removal of the unreacted part of the refractory metal is carried out through a selective etching process.

* * * * *